United States Patent
Yang et al.

(10) Patent No.: US 10,603,686 B2
(45) Date of Patent: Mar. 31, 2020

(54) MANUFACTURING METHOD FOR ULTRATHIN WHITE COVERING FILM

(71) Applicant: Hubei OMAR Electronic Technology Co., Ltd, Yichang (CN)

(72) Inventors: Haibin Yang, Yichang (CN); Fang Zhou, Yichang (CN); Chengying Yan, Yichang (CN); Yanhui Wang, Yichang (CN); Guangqi Zhou, Yichang (CN)

(73) Assignee: Hubei OMAR Electronic Technology Co., Ltd, Yichang (CN)

( * ) Notice: Subject to any disclaimer, the term of this patent is extended or adjusted under 35 U.S.C. 154(b) by 235 days.

(21) Appl. No.: 15/687,505

(22) Filed: Aug. 27, 2017

(65) Prior Publication Data

US 2018/0169700 A1    Jun. 21, 2018

(30) Foreign Application Priority Data

Dec. 16, 2016   (CN) .......................... 2016 1 1169493

(51) Int. Cl.
| | |
|---|---|
| *B05D 7/00* | (2006.01) |
| *B05D 3/00* | (2006.01) |
| *C09J 163/00* | (2006.01) |
| *C09J 7/20* | (2018.01) |
| *C09J 7/30* | (2018.01) |

(Continued)

(52) U.S. Cl.
CPC .............. *B05D 7/544* (2013.01); *B05D 3/007* (2013.01); *C09J 7/20* (2018.01); *C09J 7/21* (2018.01); *C09J 7/22* (2018.01); *C09J 7/30* (2018.01); *C09J 163/00* (2013.01); *C09J 2201/606* (2013.01); *C09J 2400/28* (2013.01); *C09J 2433/00* (2013.01); *C09J 2463/00* (2013.01); *C09J 2475/00* (2013.01);

(Continued)

(58) Field of Classification Search
None
See application file for complete search history.

(56) References Cited

U.S. PATENT DOCUMENTS

| | | | |
|---|---|---|---|
| 2010/0165262 A1* | 7/2010 | Nagase ................ | G02B 5/3033 349/96 |
| 2011/0223362 A1* | 9/2011 | Van Loon ......... | B29C 45/14688 428/34.1 |

(Continued)

*Primary Examiner* — Duy Vu N Deo
*Assistant Examiner* — Bradford M Gates
(74) *Attorney, Agent, or Firm* — Wayne & Ken, LLC; Tony Hom

(57) ABSTRACT

Disclosed is a manufacturing method for an ultrathin white covering film. The ultrathin white covering film includes a protecting film, a white ink layer, an adhesive layer and a release material, wherein the manufacturing method for the ultrathin white covering film includes the following steps: S101: preparing white ink and an adhesive; S102: coating the white ink on the protecting film and drying to form a white ink layer; S103: coating the adhesive on the white ink layer and drying to form a adhesive layer; S104: compounding the release material on the adhesive layer and coiling under certain compound temperature and compound pressure; and S105: curing to obtain the ultrathin white covering film. The present invention reduces a polyimide film layer, reduces a use part from three layers to two layers, can greatly reduce the thickness of a product, make an appearance of the product better, and greatly reduces the price.

13 Claims, 2 Drawing Sheets

(51) Int. Cl.
 *C09J 7/21* (2018.01)
 *C09J 7/22* (2018.01)
 *H01L 27/15* (2006.01)

(52) U.S. Cl.
 CPC ........ *C09J 2479/08* (2013.01); *C09J 2483/00* (2013.01); *H01L 27/153* (2013.01)

(56) References Cited

U.S. PATENT DOCUMENTS

| | | | | |
|---|---|---|---|---|
| 2014/0227463 | A1* | 8/2014 | Srivatsan | C08L 27/06 428/32.38 |
| 2015/0161915 | A1* | 6/2015 | Wild | C09J 7/21 428/32.39 |
| 2015/0239273 | A1* | 8/2015 | Sakamoto | B41M 5/345 428/32.77 |
| 2015/0266606 | A1* | 9/2015 | Wiegers | B32B 27/08 156/230 |
| 2016/0129680 | A1* | 5/2016 | Ikeda | B41M 3/008 156/275.5 |

* cited by examiner

MANUFACTURING METHOD FOR ULTRATHIN WHITE COVERING FILM

TECHNICAL FIELD

The present invention relates to a manufacturing method for an ultrathin white covering film for a printed circuit board.

BACKGROUND OF THE INVENTION

As one of main raw materials of LED light bars, a white covering film has been widely applied. At present, the white covering film mainly has two manufacturing methods. The first method is to use a white polyimide film, coat a layer of adhesive on a surface of the white polyimide film and compound the white polyimide film with a release material. The other method is to use an ordinary yellow polyimide film, coat a layer of white ink on a surface of the ordinary yellow polyimide film, coat a layer of adhesive on another side of the yellow polyimide film and compound the yellow polyimide film with a release material.

However, since the price of the white polyimide film is very expensive, the white polyimide film is not often applied in a market. Most of users still select a method for coating a layer of white ink on the ordinary yellow polyimide film.

With the development of thinning of products, higher and higher requirements are also proposed for the thickness of the white covering film. The manufacturing method for the pure white polyimide film is difficult to satisfy this need currently because on one hand, the price is excessively expensive, and on the other hand, a covering property and other characteristics after the products become thinner are difficult to be realized simultaneously. However, the manufacturing method for coating a layer of white ink on the ordinary yellow polyimide film is also difficult to satisfy a thinning need because the thickness is difficult to be reduced due to existence of three layers such as a polyimide layer, an adhesive layer and a white ink layer in spite of low price.

SUMMARY OF THE INVENTION

The purpose of the present invention is to provide a manufacturing method for an ultrathin white covering film. Compared with an existing manufacturing method for coating a layer of white ink on an ordinary yellow polyimide film, the manufacturing method reduces a polyimide film, reduces a use part from three layers to two layers, can greatly reduce the thickness of a product, can also make an appearance of the product better, and greatly reduces the price relative to the manufacturing method for the pure white polyimide film.

The present invention is also suitable for ink of other colors except for white.

To solve the above technical problem, the present invention adopts the following technical solution to realize.

A new technical line for production of the white covering film is adopted: after white ink is coated on one side of a pressure sensitive adhesive of the protecting film, an adhesive is coated on an ink surface and compounded with a release material. Specific description is as follows.

The white ink and the adhesive used in the present invention can be prepared according to existing known preparation methods.

The white ink and the adhesive are prepared according to of formulation requirements as follows: stripping a release layer of the protecting film, coating ink on one side with the pressure sensitive adhesive, drying and solidifying through an oven, coiling, coating the adhesive on a surface of the ink, compounding a release material after drying and solidifying through the oven, coiling, controlling the curing to a needed adhesive overflow quantity, cutting according to a required width, inspecting the appearance, and packing and warehousing. A flow is as follows:

preparing the white ink and the adhesive→coating the white ink and drying→coating an adhesive and drying→compounding the release material and coiling→curing→cutting→inspecting the appearance→packing.

The white ink is an epoxy series, a polyacrylate series, a saturated polyester series or an organic silicon series, and is preferably polyester series ink. A thickness of the above white ink is 11 to 24 and preferably 8 to 15 μm. A drying condition of the above white ink is to achieve a drying effect of 1 to 3 min at 160° C. to 190° C., and preferably a drying effect of 2 min at 190° C.

The adhesive is an epoxy series, a polyacrylate series or a polyester series, and preferably the epoxy series. A thickness of the above adhesive is 10 to 25 μm. A drying condition of the above adhesive is to achieve a drying effect of 1 to 3 min at 150° C. to 170° C., and preferably to achieve a drying effect of 1.5 min at 160° C.

The protecting film is a high to temperature resistant protecting film. A base material used for the above protecting film is a high to temperature resistant polyester series. The pressure sensitive adhesive used for the above protecting film is a polyacrylate series, a polyurethane series or an organic silicon series, and preferably an organic silicon series adhesive. A stripping force between the pressure sensitive adhesive used for the above protecting film and the ink is 15 to 40 CN/5 cm, and preferably 15 to 25 CN/5 cm.

The release material is release paper or a release film, and preferably the release paper. A release force of the above release paper is 5 to 20 CN/5 cm, and preferably 8 to 15 CN/5 cm.

The present invention has the beneficial effects that: the white ink is coated on the surface of the protecting film and can form a film; meanwhile, a bonding force between the ink and the adhesive is strong enough; and sizes of the stripping force between the protecting film and the ink and the release force between the adhesive and the release material are appropriate for convenient operation, thereby achieving effects of reducing the thickness and the cost without using the polyimide film, protecting the surface of the ink by using the protecting film and also facilitating operation during use.

Figure 1:
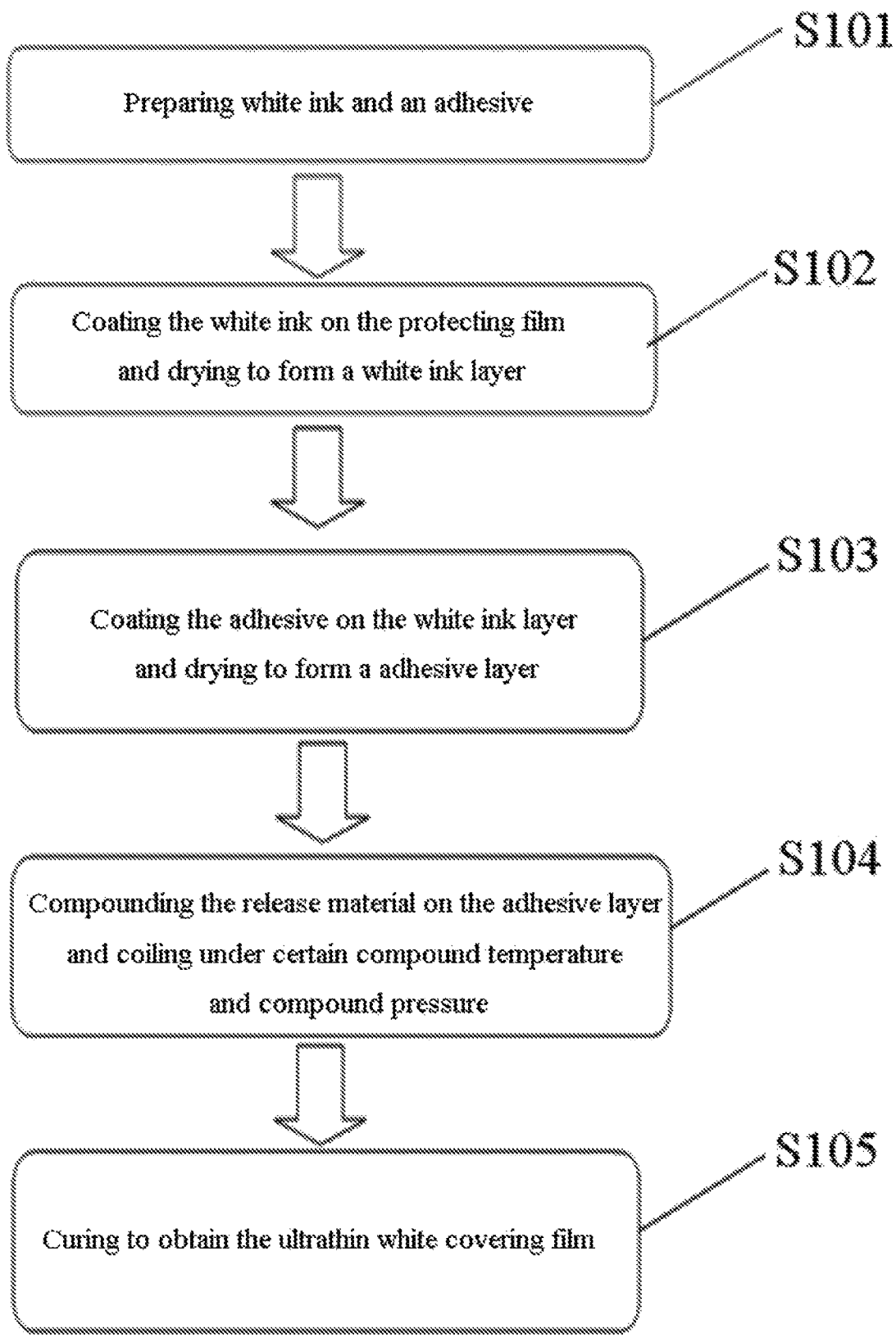
FIG. 1 is a diagram of manufacturing steps of a manufacturing method for an ultrathin white covering film in the present invention.
Figure 2:
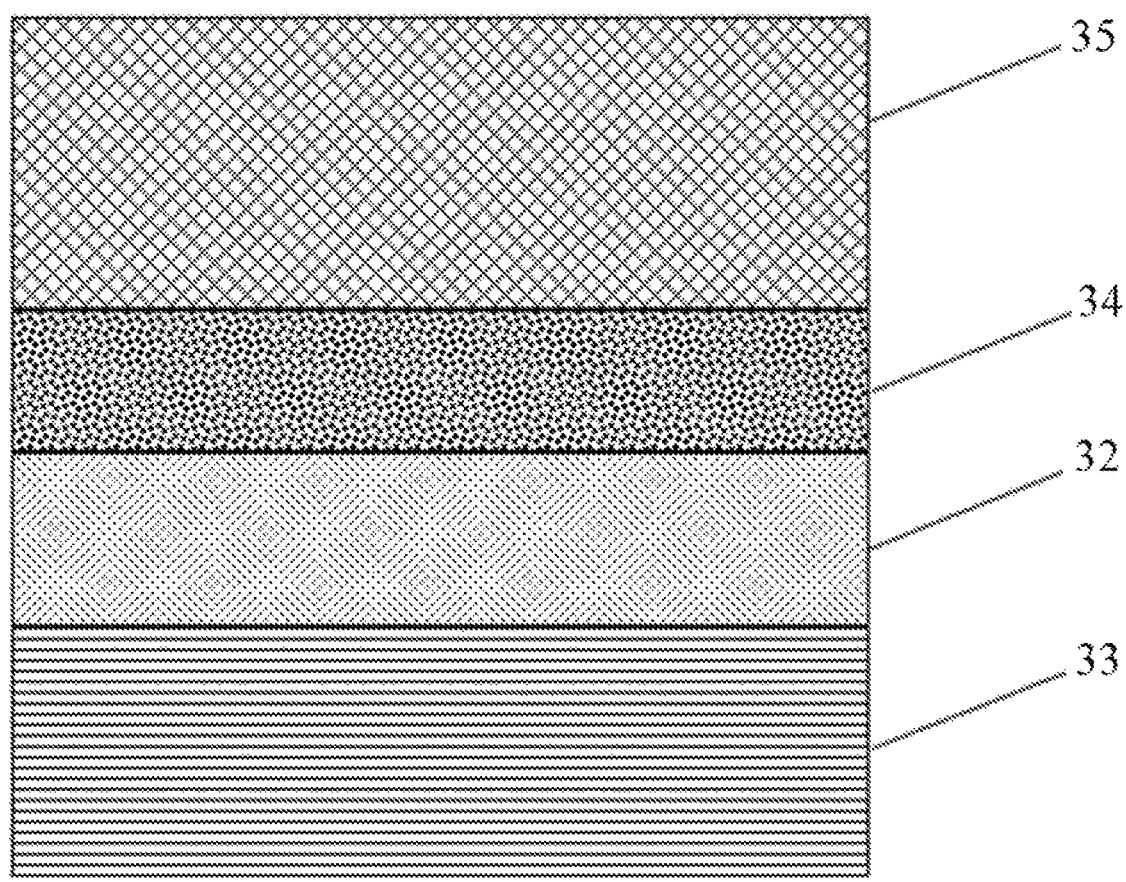
FIG. 2 is a structural diagram of an ultrathin white covering film in the present invention.

REFERENCE NUMERALS 32. adhesive layer; 33. release material; 34. white ink layer; and 35. protecting film

DETAILED DESCRIPTION OF THE INVENTION

The present invention is further described below in combination with embodiments.

EMBODIMENTS

Step S101: preparing the white ink and the adhesive: preparing according to existing preparation methods respectively.

Step S102: coating the white ink on the protecting film and drying to form a white ink layer (34): setting oven temperature of a coating machine (such as 80° C., 110° C., 140° C., 170° C., 190° C., 190° C., 160° C. and 120° C.; to dry the adhesive as far as possible, setting 190° C. as much as possible without influencing the appearance of the surface of the adhesive; setting drying time of 1.5 to 2 min), a speed (such as 8 to 12 m/min) and other parameters according to characteristics of the white ink; coating the surface of the pressure sensitive adhesive of the protecting film (35) to a needed thickness (such as 15 μm); drying through a drying tunnel; and coiling after generating a solidifying reaction, wherein a drying condition is to achieve a drying effect of 1 to 3 min at 160° C. to 190° C.

Step S103: coating the adhesive layer (32) on the white ink and drying to form a adhesive layer (34): setting oven temperature of a coating machine (such as 80° C., 110° C., 140° C., 160° C., 160° C., 160° C., 120° C. and 70° C.; to dry the adhesive as far as possible, setting 160° C. as much as possible without influencing the appearance of the surface of the adhesive; setting drying time of 1 to 1.5 min), a speed (such as 10 to 15 m/min), etc. according to characteristics of the adhesive (such as the epoxy series); coating the surface of the coated ink to a needed thickness (such as 15 μm); drying through a drying tunnel; and generating some solidifying reactions, wherein a drying condition is to achieve a drying effect of 1 to 3 min at 150° C. to 170° C.

Step S104: compounding the release material (33) on the adhesive layer (32) and coiling under certain compound temperature and compound pressure: compounding under a set temperature (such as 50° C. to 70° C.) and pressure (such as 147.1 to 294.1 KPa) and coiling.

Step S105: curing to obtain the ultrathin white covering film, wherein a curing procedure is to place the coiled material in an oven with a set temperature (preserving heat at 40° C. to 60° C. for 2 to 30 hr) to enable the adhesive to generate a reaction until an adhesive overflow quantity reaches a needed degree (such as 0.05 to 0.15 mm).

Then, cutting, inspection and packing are performed conventionally.

A cutting procedure is to cut the coiled material on a cutting machine to a needed width and cut off scraps.

An inspection procedure is to inspect the product appearance of the cut material on an inspection machine and remove products with bad appearances.

A packing procedure is to pack the qualified products after inspection according to packing requirements.

When the ultrathin white covering film manufactured by the present invention is used for FPC processing, operation is easy; the protecting film (35) can perform a good protection effect on the surface of the ink in an entire FPC flow; and finally the protecting film (35) is stripped off. Since no polyimide layer is used, an entire thickness is greatly reduced and an ultrathin purpose is achieved.

| Item | Test Results |
| --- | --- |
| Stripping force between ink surface and protecting film (CN/5 cm) | 20 |
| Release force between adhesive surface and release paper (CN/5 cm) | 10 |
| Stripping strength between adhesive surface and copper surface (kN/cm) | 1.0 |
| Bonding force 1 between adhesive layer and ink layer (kN/cm) | 0.8 |
| Adhesive overflow quantity (mm) | 0.10 |
| Heat resistance of soldering tin (° C./10 Sec) | 300 |

Remark 1: The ink is first coated on a carrier film and then the adhesive is coated on the surface of the ink for test.

What is claimed is:

1. A manufacturing method for a white covering film, the white covering film comprising a protecting film, a white ink layer, an adhesive layer and a release material from outside to inside, wherein the manufacturing method for the white covering film comprises the following steps:
   S101: preparing white ink and an adhesive;
   S102: coating the white ink on the protecting film and drying to form the white ink layer;
   S103: coating the adhesive on the white ink layer and drying to form the adhesive layer;
   S104: compounding the release material on the adhesive layer and coiling under certain compound temperature and compound pressure; and
   S105: curing to obtain the white covering film
   wherein in the step S102, temperature conditions of an oven of a coating machine for coating the white ink layer are 160° C. to 190° C.; a coating speed is 8 to 12 m/min; and drying time is 1.5 to 3 min;
   a pressure sensitive adhesive is coated between the protecting film and the white ink layer; the pressure sensitive adhesive is a polyacrylate series, a polyurethane series or an organic silicon series, and a stripping force between the pressure sensitive adhesive and the ink used for the white ink layer is 15 to 40 cN/5 cm.

2. The manufacturing method for the white covering film according to claim 1, wherein in the step S103, temperature conditions of an oven of a coating machine for coating the adhesive layer are 150° C. to 170° C.; a coating speed is 10 to 15 m/min; and drying time is 1 to 3 min.

3. The manufacturing method for the white covering film according to claim 1, wherein in the step S104, a compound temperature is 50° C. to 70° C. and a compound pressure is 147.1 to 294.1 kPa.

4. The manufacturing method for the white covering film according to claim 1, wherein in the step S105, a curing condition is to preserve heat at 40° C. to 60° C. for 2 to 30 hours.

5. The manufacturing method for the white covering film according to claim 1, wherein a thickness of the white ink layer is 11 to 24 μm, and a thickness of the adhesive layer is 10 to 25 μm.

6. The manufacturing method for the white covering film according to claim 1, wherein a thickness of the white ink layer is 8 to 15 μm; and
   drying conditions of the white ink were at 190° C. for 2 min.

7. The manufacturing method for the white covering film according to claim 1, wherein a base material used for the protecting film is a polyester series; the white ink layer is an epoxy series, a polyacrylate series, a saturated polyester series or an organic silicon series; and the adhesive layer is an epoxy series, a polyacrylate series or a polyester series.

8. The manufacturing method for the white covering film according to claim 1, wherein the adhesive layer is epoxy series; and drying conditions of the adhesive were at 160° C. for 1.5 min.

9. The manufacturing method for the white covering film according to claim 1, wherein the pressure sensitive adhesive coated on the protecting film is an organic silicon series, and the stripping force between the pressure sensitive adhesive and the ink used for the white ink layer is 15 to 25 cN/5 cm.

10. The manufacturing method for the white covering film according to claim 1, wherein the release material is release paper or a release film.

11. The manufacturing method for the white covering film according to claim 10, wherein the release material is release paper.

12. The manufacturing method for the white covering film according to claim 11, wherein a release force of the release material is 5 to 20 cN/5 cm.

13. The manufacturing method for the white covering film according to claim 11, wherein a release force of the release material is 8 to 15 cN/5 cm.

* * * * *